(12) United States Patent
Tung et al.

(10) Patent No.: US 11,470,745 B1
(45) Date of Patent: Oct. 11, 2022

(54) ELECTRONIC DEVICE AND HEAT DISSIPATION ASSEMBLY

(71) Applicants: Inventec (Pudong) Technology Corporation, Shanghai (CN); INVENTEC CORPORATION, Taipei (TW)

(72) Inventors: Kai-Yang Tung, Taipei (TW); Hung-Ju Chen, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 17/349,206

(22) Filed: Jun. 16, 2021

(30) Foreign Application Priority Data

Jun. 2, 2021 (CN) .......................... 202110614779.6

(51) Int. Cl.
*H05K 7/20* (2006.01)

(52) U.S. Cl.
CPC ..... *H05K 7/20818* (2013.01); *H05K 7/20309* (2013.01); *H05K 7/20318* (2013.01); *H05K 7/20336* (2013.01)

(58) Field of Classification Search
CPC ........... H01L 23/473; H01L 2924/1432; H01L 2924/1433; F28D 15/0266; F28D 15/0233; F28D 15/0241; F28D 2021/0031; F28D 1/0477; F28D 2021/0028; H05K 7/20809; H05K 7/20318; H05K 7/20309; H05K 7/20818; H05K 7/203; H05K 7/20254; H05K 7/20936; H05K 7/20509; H05K 7/20409; H05K 7/208; H05K 7/20418; H05K 7/20154; G06F 1/20
USPC ..... 361/700, 679.47, 699, 679.53, 702, 719, 361/701, 697, 698, 704, 688, 717, 676, 361/696, 718, 711; 165/104.33, 104.21, 165/80.4, 80.5, 80.2; 257/715, 714,
(Continued)

(56) References Cited

U.S. PATENT DOCUMENTS 7,347,250 B2 *  3/2008  Li ..................... H01L 23/427
                                                    165/104.33
7,431,071 B2 * 10/2008  Wenger ............... F28D 15/043
                                                    165/47
(Continued)

*Primary Examiner* — Mandeep S Buttar
(74) *Attorney, Agent, or Firm* — Locke Lord LLP; Tim Tingkang Xia, Esq.

(57) ABSTRACT

An electronic device configured to be connected to external heat dissipation device and including chassis, heat source and heat dissipation assembly. The heat source is disposed on the chassis. The heat dissipation assembly includes evaporator and condenser. The evaporator is in thermal contact with the heat source. The condenser is disposed on the chassis and comprises first thermally conductive plate, second thermally conductive plate and third thermally conductive plate that are stacked on one another. A condensation space is formed between the first thermally conductive plate and the second thermally conductive plate. A first liquid-cooling space is formed between the second thermally conductive plate and the third thermally conductive plate. The condensation space is in fluid communication with the evaporator. The first liquid-cooling space is not in fluid communication with the condensation space and is configured to be in fluid communication with the external heat dissipation device.

10 Claims, 3 Drawing Sheets

(58) Field of Classification Search
USPC ...... 257/23.098, 23.102, 707, 713; 62/259.2, 62/119
See application file for complete search history.

(56) References Cited

U.S. PATENT DOCUMENTS

| | | | |
|---|---|---|---|
| 10,962,301 B2* | 3/2021 | Kurashima | ......... F28D 15/0275 |
| 2004/0040695 A1* | 3/2004 | Chesser | ............... H01L 23/427 |
| | | | 165/104.31 |
| 2007/0012427 A1* | 1/2007 | Liu | ....................... H01L 23/427 |
| | | | 165/104.33 |
| 2007/0242438 A1* | 10/2007 | Belits | ................ H05K 7/20809 |
| | | | 165/185 |
| 2008/0164010 A1* | 7/2008 | Kang | .................... H01L 23/427 |
| | | | 165/104.33 |
| 2011/0232874 A1* | 9/2011 | Xu | ....................... H01L 23/427 |
| | | | 165/104.21 |
| 2020/0340755 A1* | 10/2020 | Horng | ................ F28D 15/0266 |
| 2022/0142001 A1* | 5/2022 | Pokharna | ........... F28D 15/0275 |
| | | | 361/700 |

\* cited by examiner

ELECTRONIC DEVICE AND HEAT DISSIPATION ASSEMBLY

CROSS-REFERENCE TO RELATED APPLICATIONS

This non-provisional application claims priority under 35 U.S.C. § 119(a) on Patent Application No(s). 202110614779.6 filed in China, on Jun. 2, 2021, the entire contents of which are hereby incorporated by reference.

BACKGROUND OF THE INVENTION

Technical Field of the Invention

The invention relates to an electronic device and a heat dissipation assembly, more particularly to an electronic device and a heat dissipation assembly including an evaporator and a condenser.

Description of the Related Art

In general, in an open-loop thermosiphon system of a server, a condensation portion of a tube is in thermal contact with an outer surface of a top cover of the liquid-cooling plate, and the tube and the liquid-cooling plate are disposed in a chassis of the server. In addition, the liquid-cooling plate is in fluid communication with an external heat dissipation device outside the chassis via another tube. In this way, the liquid coolant circulated between the external heat dissipation device and the liquid-cooling plate can cool the working fluid in the condensation portion of the tube in the thermosiphon system of the server.

However, since the condensation portion of the tube is in thermal contact with the outer surface of the top cover of the liquid-cooling plate, heat is transferred between the working fluid in the condensation portion and the liquid coolant in the liquid-cooling plate via a wall of the tube and the top cover of the liquid-cooling plate. Therefore, heat is ineffectively transferred between the working fluid in the condensation portion and the liquid coolant in the liquid-cooling plate since there are too many media (the wall of the tube and the top cover) between them. Accordingly, the open-loop thermosiphon system is difficult to be applied to a heat source generating a large amount of heat.

SUMMARY OF THE INVENTION

The invention is to provide an electronic device and a heat dissipation device to allow heat to be effectively transferred between the working fluid in the condenser and the liquid coolant in the liquid-cooling plate.

One embodiment of this invention provides an electronic device configured to be connected to an external heat dissipation device and including a chassis, a heat source and a heat dissipation assembly. The heat source is disposed on the chassis. The heat dissipation assembly includes an evaporator and a condenser. The evaporator is in thermal contact with the heat source. The condenser is disposed on the chassis and comprises a first thermally conductive plate, a second thermally conductive plate and a third thermally conductive plate that are stacked on one another. A condensation space is formed between the first thermally conductive plate and the second thermally conductive plate. A first liquid-cooling space is formed between the second thermally conductive plate and the third thermally conductive plate. The condensation space is in fluid communication with the evaporator. The first liquid-cooling space is not in fluid communication with the condensation space and is configured to be in fluid communication with the external heat dissipation device.

Another embodiment of this invention provides a heat dissipation assembly configured to be in thermal contact with a heat source and configured to be connected to an external heat dissipation device. The heat dissipation assembly includes an evaporator, and a condenser. The evaporator is configured to be in thermal contact with the heat source. The condenser includes a first thermally conductive plate, a second thermally conductive plate and a third thermally conductive plate that are stacked on one another. A condensation space is formed between the first thermally conductive plate and the second thermally conductive plate. A first liquid-cooling space is formed between the second thermally conductive plate and the third thermally conductive plate. The condensation space is in fluid communication with the evaporator. The first liquid-cooling space is not in fluid communication with the condensation space and is configured to be in fluid communication with the external heat dissipation device.

According to the electronic device and the heat dissipation assembly disclosed by the above embodiments, a condensation space configured for the circulation of the working fluid is formed between the first thermally conductive plate and the second thermally conductive plate, and the first liquid-cooling space configured for the circulation of the liquid coolant is formed between the second thermally conductive plate and the third thermally conductive plate. Thus, heat is transferred between the working fluid in the condensation space and the liquid coolant in the first liquid-cooling space merely via the second thermally conductive plate. In this way, not only the heat can be effectively transferred between the working fluid in the condensation space and the liquid coolant in the first liquid-cooling space, but also the heat exchange area between the working fluid in the condensation space and the liquid coolant in the first liquid-cooling space is increased, thereby allowing the heat dissipation assembly to be applied to the heat source generating a large amount of heat.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

Figure 1:
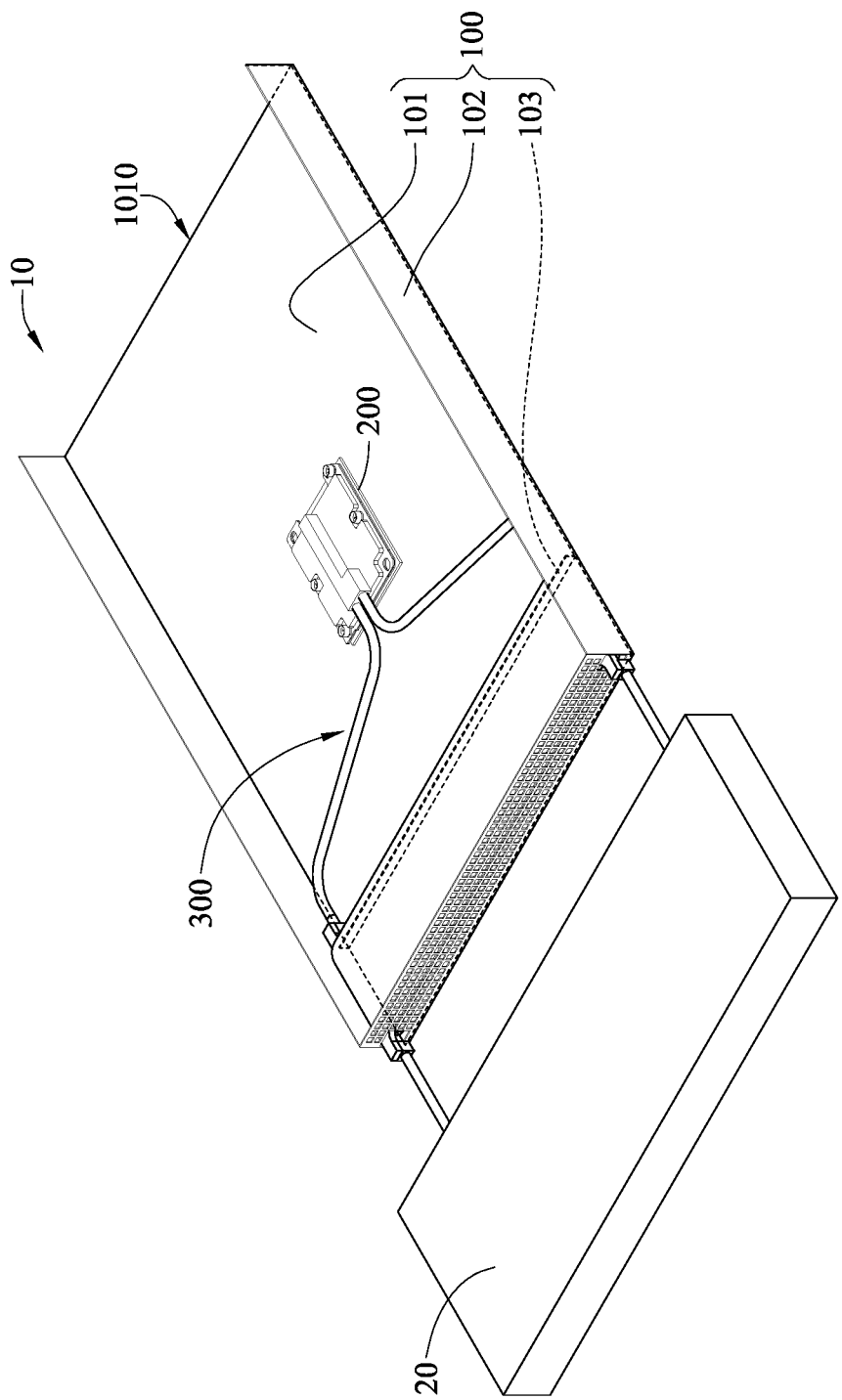
FIG. 1 is a perspective view of an electronic device according to an embodiment of the invention and an external heat dissipation device.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
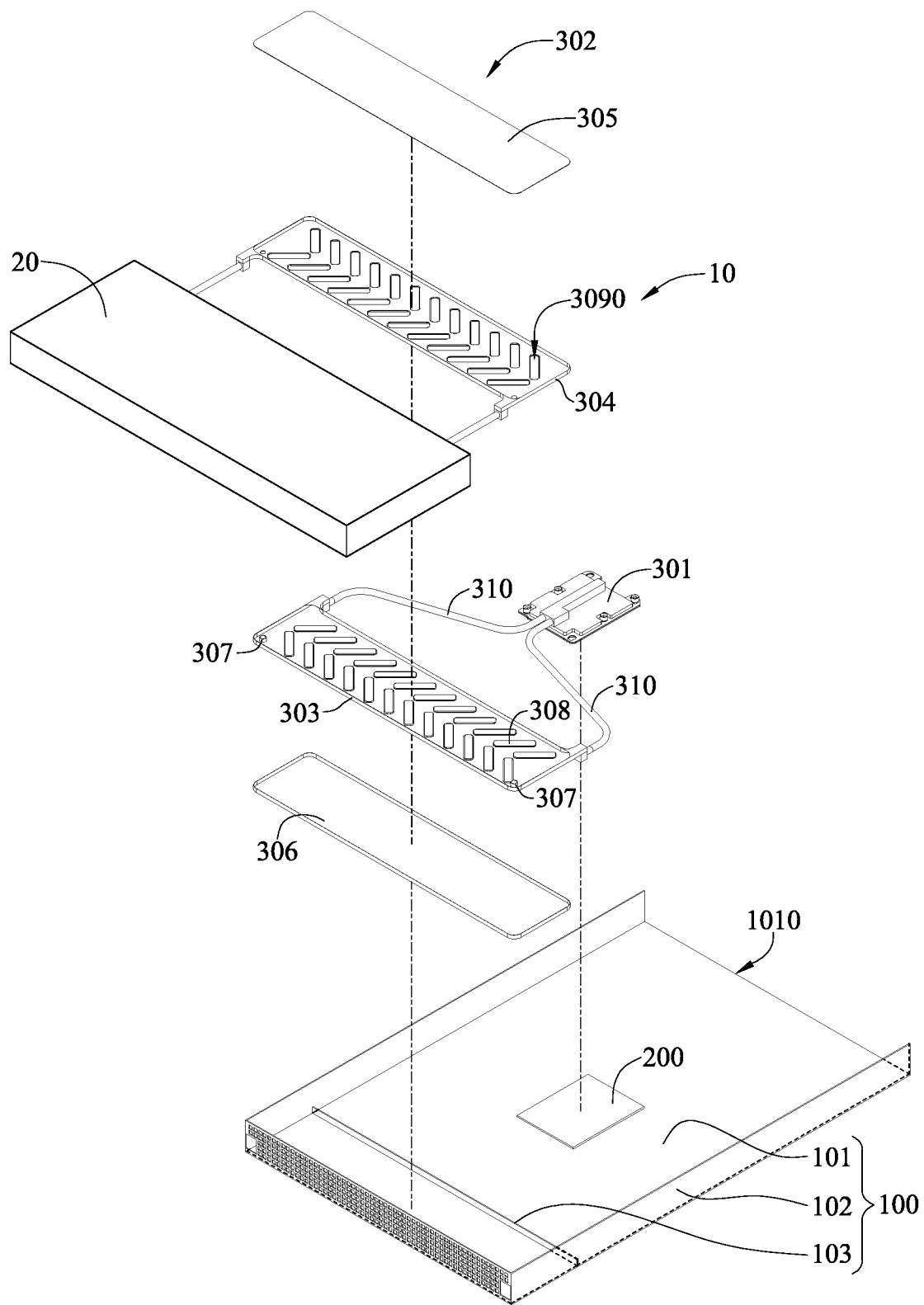
FIG. 2 is an exploded view of the external heat dissipation device and the electronic device in FIG. 1.
Figure 3:
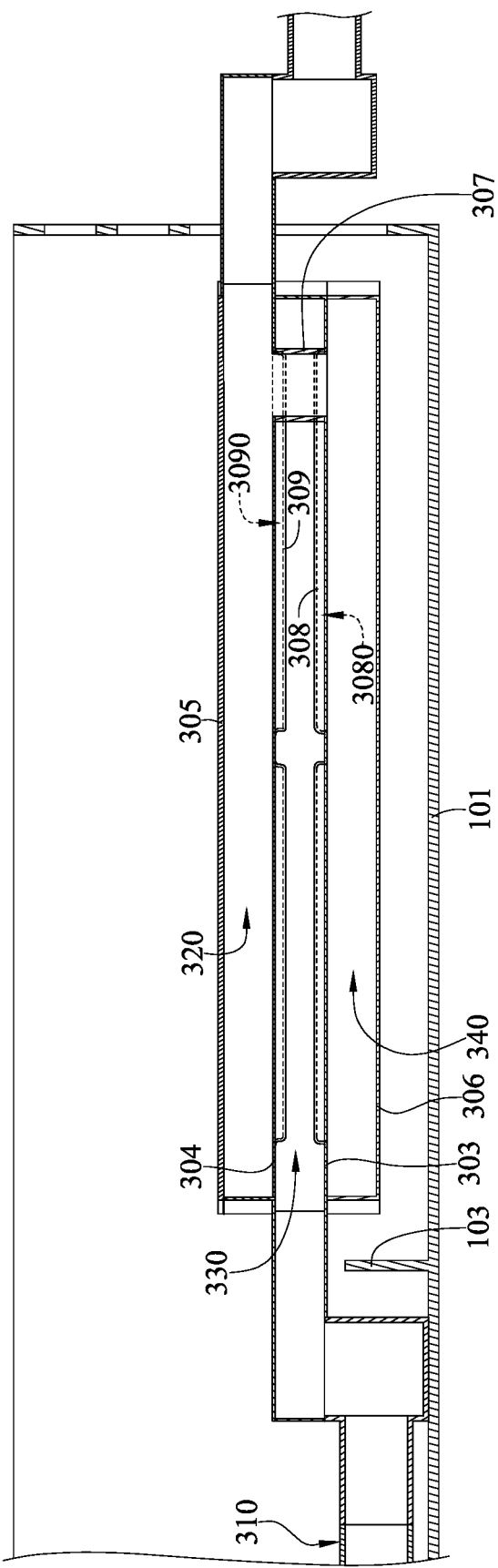
FIG. 3 is a partially enlarged side cross-sectional view of the electronic device shown in FIG. 1.

Please refer to FIGS. 1 to 3, where FIG. 1 is a perspective view of an electronic device 10 according to an embodiment of the invention and an external heat dissipation device 20, FIG. 2 is an exploded view of the external heat dissipation device 20 and the electronic device 10 in FIG. 1, and FIG. 3 is a partially enlarged side cross-sectional view of the electronic device 10 shown in FIG. 1. In this embodiment, the electronic device 10 is configured to be connected to the external heat dissipation device 20, and includes a chassis 100, a heat source 200 and a heat dissipation assembly 300.

In this embodiment, the chassis 100 includes a bottom plate 101, a wall 102 and a partition 103. The wall 102 stands on a peripheral edge 1010 of the bottom plate 101 and is, for example, U-shaped. The partition 103 stands on the bottom plate 101 and is connected to two parts of the wall 102 that are parallel to each other. The heat source 200 is disposed on the bottom plate 101 and is, for example, a central processing unit or a graphic processing unit.

The heat dissipation assembly 300 includes an evaporator 301, a condenser 302 and two tubes 310. The evaporator 301 is in thermal contact with a side of the heat source 200 that is located away from the bottom plate 101. In this embodiment, the condenser 302 is disposed on the bottom plate 101. In this embodiment, the condenser 302 includes a first thermally conductive plate 303, a second thermally conductive plate 304, a third thermally conductive plate 305, a fourth thermally conductive plate 306, a plurality of connecting tubes 307, a plurality of first protrusions 308 and a plurality of second protrusions 309.

The first thermally conductive plate 303, the second thermally conductive plate 304 and the third thermally conductive plate 305 are sequentially stacked on one another, and the fourth thermally conductive plate 306 is stacked on a side of the first thermally conductive plate 303 that is located away from the second thermally conductive plate 304. That is, the fourth thermally conductive plate 306, the first thermally conductive plate 303, the second thermally conductive plate 304 and the third thermally conductive plate 305 are sequentially stacked on one another. A first liquid-cooling space 320 is formed between the second thermally conductive plate 304 and the third thermally conductive plate 305. A condensation space 330 is formed between the first thermally conductive plate 303 and the second thermally conductive plate 304. A second liquid-cooling space 340 is formed between the fourth thermally conductive plate 306 and the first thermally conductive plate 303. The condensation space 330 is located between the first liquid-cooling space 320 and the second liquid-cooling space 340. In this embodiment, the condensation space 330 is in fluid communication with the evaporator 301 via the two tubes 310. The first liquid-cooling space 320 and the second liquid-cooling space 340 are not in fluid communication with the condensation space 330, and the first liquid-cooling space 320 is in fluid communication with the second liquid-cooling space 340 via the connecting tubes 307. Specifically, two opposite ends of each connecting tube 307 are respectively in fluid communication with the first liquid-cooling space 320 and the second liquid-cooling space 340, and the first liquid-cooling space 320 and the second liquid-cooling space 340 are connected in parallel. The connecting tubes 307 are disposed through but not in fluid communication with the condensation space 330. The first liquid-cooling space 320 is in fluid communication with the external heat dissipation device 20, such that the second liquid cooling space 340 is also in fluid communication with the external heat dissipation device 20 via the connecting tubes 307 and the first liquid-cooling space 320.

In this embodiment, the first thermally conductive plate 303, the second thermally conductive plate 304, the third thermally conductive plate 305 and the fourth thermally conductive plate 306 are made of, for example, metal.

The first protrusions 308 protrude from the first thermally conductive plate 303 towards the condensation space 330. In this embodiment, the first protrusions 308 are formed by, for example, performing stamping process on the first thermally conductive plate 303, such that the first thermally conductive plate 303 has a plurality of recesses 3080 that are located in the second liquid-cooling space 340. The second protrusions 309 protrude from the second thermally conductive plate 304 towards the condensation space 330. In this embodiment, the second protrusions 309 are formed by, for example, performing stamping process on the second thermally conductive plate 304, such that the second thermally conductive plate 304 has a plurality of recesses 3090 that are located in the first liquid-cooling space 320.

A working fluid (not shown) is configured to circulate among the evaporator 301, the tubes 310 and the condensation space 330, where the working fluid is, for example, a refrigerant. A liquid coolant (not shown) is configured to circulate among the first liquid-cooling space 320, the second liquid-cooling space 340, the connecting tubes 307 and the external heat dissipation device 20, where the liquid coolant is, for example, water. After the working fluid absorbs heat in the evaporator 301 which is transferred from the heat source 200, the working fluid vaporizes and then flows to the condensation space 330 via the tubes 310. The liquid coolant flowing in the first liquid-cooling space 320 and the second liquid-cooling space 340 cools the vaporized working fluid flowing into the condensation space 330 so that the vaporized working fluid is condensed into liquid form. Then, the liquid working fluid flows back to the evaporator 301 via the tubes 310. On the other hand, the liquid coolant absorbing the heat from the working fluid flows to the external heat dissipation device 20 and is cooled by the external heat dissipation device 20. In this embodiment, the working fluid and the liquid coolant flow in the condenser 302 respectively along two opposite directions, such that the heat transferring efficiency between the working fluid and the liquid coolant is enhanced.

In addition, in this embodiment, the partition 103 is located between the heat source 200 and the condenser 302 so as to prevent the liquid coolant leaked from the condenser 302 from further flowing to the heat source 200. In other embodiments, the chassis may not include the partition.

Note that in other embodiments, the condenser may not include the fourth thermally conductive plate. That is, the condenser may not have the second liquid-cooling space, and the working fluid in the condensation space may be cooled merely by the liquid coolant flowing in the first liquid-cooling space.

In other embodiments, the first protrusions may protrude from the first thermally conductive plate towards the second liquid-cooling space. In still other embodiments, the condenser may not include the first protrusions. In other embodiments, the second protrusions may protrude from the second thermally conductive plate towards the first liquid-cooling space. In still other embodiments, the condenser may not include the second protrusions.

In other embodiments, the condenser may include a single connecting tube. Furthermore, in other embodiments, the connecting tubes may not be disposed through the condensation space and may be located outside the condensation space.

According to the electronic device and the heat dissipation assembly disclosed by the above embodiments, a condensation space configured for the circulation of the working fluid is formed between the first thermally conductive plate and the second thermally conductive plate, and the first liquid-cooling space configured for the circulation of the liquid coolant is formed between the second thermally conductive plate and the third thermally conductive plate. Thus, heat is transferred between the working fluid in the condensation space and the liquid coolant in the first liquid-cooling space merely via the second thermally conductive plate. In this way, not only the heat can be effectively transferred between the working fluid in the condensation space and the liquid coolant in the first liquid-cooling space, but also the heat exchange area between the working fluid in the condensation space and the liquid coolant in the first liquid-cooling space is increased, thereby allowing the heat dissipation assembly to be applied to the heat source generating a large amount of heat.

Moreover, since the condensation space is located between the first liquid-cooling space and the second liquid-cooling space, the working fluid in the condensation space is cooled by the liquid coolant in both of the first liquid-cooling space and the second liquid-cooling space, which enhances the heat transferring efficiency between the working fluid and the liquid coolant.

Furthermore, since the first protrusions and the second protrusions protrude towards the condensation space, the first protrusions and the second protrusions facilitate the formation of the turbulent flow of the working fluid in the condensation space, thereby enhancing the heat transferring efficiency between the working fluid and the liquid coolant. In addition, since the recesses are respectively located in the first liquid-cooling space and the second liquid-cooling space instead of the condensation space, the flow resistance of the working fluid that is located in the condensation space and is in the form of gas-liquid mixture is prevented from being increased due to the recesses.

In an embodiment, the server (i.e., electronic device) disclosed by the invention can be applied to artificial intelligence (AI) computing, edge computing and can be used as 5G server, cloud computing server, or internet of vehicle server.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. An electronic device, configured to be connected to an external heat dissipation device, the electronic device comprising:
   a chassis;
   a heat source, disposed on the chassis; and
   a heat dissipation assembly, comprising:
      an evaporator, in thermal contact with the heat source; and
      a condenser, wherein the condenser is disposed on the chassis and comprises a first thermally conductive plate, a second thermally conductive plate and a third thermally conductive plate that are stacked on one another, a condensation space is formed between the first thermally conductive plate and the second thermally conductive plate, a first liquid-cooling space is formed between the second thermally conductive plate and the third thermally conductive plate, the condensation space is in fluid communication with the evaporator, the first liquid-cooling space is not in fluid communication with the condensation space and is configured to be in fluid communication with the external heat dissipation device.

2. The electronic device according to claim 1, wherein the condenser further comprises a fourth thermally conductive plate, the fourth thermally conductive plate is stacked on a side of the first thermally conductive plate that is located away from the second thermally conductive plate, a second liquid-cooling space is formed between the fourth thermally conductive plate and the first thermally conductive plate, the second liquid-cooling space is in fluid communication with the first liquid-cooling space and is not in fluid communication with the condensation space, the second liquid-cooling space is configured to be in fluid communication with the external heat dissipation device, and the condensation space is located between the first liquid-cooling space and the second liquid-cooling space.

3. The electronic device according to claim 2, wherein the condenser further comprises a plurality of first protrusions protruding from the first thermally conductive plate towards the condensation space.

4. The electronic device according to claim 3, wherein the condenser further comprises a plurality of second protrusions protruding from the second thermally conductive plate towards the condensation space.

5. The electronic device according to claim 2, wherein the condenser further comprises a plurality of connecting tubes, two opposite ends of each of the plurality of connecting tubes are respectively in fluid communication with the first liquid-cooling space and the second liquid-cooling space.

6. The electronic device according to claim 5, wherein the plurality of connecting tubes are disposed through the condensation space.

7. The electronic device according to claim 1, wherein the chassis comprises a bottom plate, a wall and a partition, the heat source and the condenser are disposed on the bottom plate, the wall stands on a peripheral edge of the bottom plate, the partition stands on the bottom plate and is connected to two opposite sides of the wall, and the partition is located between the heat source and the condenser.

8. A heat dissipation assembly, configured to be in thermal contact with a heat source and configured to be connected to an external heat dissipation device, the heat dissipation assembly comprising:
   an evaporator, configured to be in thermal contact with the heat source; and
   a condenser, wherein the condenser comprises a first thermally conductive plate, a second thermally conductive plate and a third thermally conductive plate that are stacked on one another, a condensation space is formed between the first thermally conductive plate and the second thermally conductive plate, a first liquid-cooling space is formed between the second thermally conductive plate and the third thermally conductive plate, the condensation space is in fluid communication with the evaporator, the first liquid-cooling space is not in fluid communication with the condensation space and is configured to be in fluid communication with the external heat dissipation device.

9. The heat dissipation assembly according to claim 8, wherein the condenser further comprises a fourth thermally conductive plate, the fourth thermally conductive plate is stacked on a side of the first thermally conductive plate that is located away from the second thermally conductive plate, a second liquid-cooling space is formed between the fourth thermally conductive plate and the first thermally conductive plate, the second liquid-cooling space is in fluid communication with the first liquid-cooling space and is not in fluid communication with the condensation space, the second liquid-cooling space is configured to be in fluid communication with the external heat dissipation device, and the condensation space is located between the first liquid-cooling space and the second liquid-cooling space.

10. The heat dissipation assembly according to claim 9, wherein the condenser further comprises a plurality of first protrusions protruding from the first thermally conductive plate towards the condensation space.

\* \* \* \* \*